(12) United States Patent
Atkinson et al.

(10) Patent No.: US 8,551,682 B2
(45) Date of Patent: Oct. 8, 2013

(54) METAL CONSERVATION WITH STRIPPER SOLUTIONS CONTAINING RESORCINOL

(75) Inventors: John M. Atkinson, Fishers, IN (US); Kimberly Dona Pollard, Anderson, IN (US); Gene Goebel, Danville, CA (US)

(73) Assignee: Dynaloy, LLC, Kingsport, TN (US)

( * ) Notice: Subject to any disclaimer, the term of this patent is extended or adjusted under 35 U.S.C. 154(b) by 0 days.

(21) Appl. No.: 11/928,728

(22) Filed: Oct. 30, 2007

(65) Prior Publication Data
US 2009/0047609 A1     Feb. 19, 2009

Related U.S. Application Data

(60) Provisional application No. 60/956,030, filed on Aug. 15, 2007.

(51) Int. Cl.
*C11D 7/26* (2006.01)
*G03F 7/42* (2006.01)

(52) U.S. Cl.
USPC ............ 430/256; 430/329; 510/175; 510/176

(58) Field of Classification Search
USPC ................. 438/745, 689; 430/318, 329, 313, 430/270.1, 256; 134/1.2; 510/176, 175
See application file for complete search history.

(56) References Cited

U.S. PATENT DOCUMENTS

| | | | |
|---|---|---|---|
| 5,308,745 A | 5/1994 | Schwartzkopf | |
| 5,417,877 A * | 5/1995 | Ward ............................ | 510/176 |
| 5,648,324 A | 7/1997 | Honda et al. | |
| 5,795,702 A | 8/1998 | Tanabe et al. | |
| 5,798,323 A | 8/1998 | Honda et al. | |
| 5,840,622 A * | 11/1998 | Miles et al. .................... | 438/622 |
| 5,946,600 A * | 8/1999 | Hurwitz et al. ............... | 438/688 |
| 6,319,835 B1 | 11/2001 | Sahbari et al. | |
| 6,372,410 B1 | 4/2002 | Ikemoto et al. | |
| 6,531,436 B1 | 3/2003 | Sahbari et al. | |
| 6,579,668 B1 | 6/2003 | Baik et al. | |
| 6,638,694 B2 | 10/2003 | Ikemoto et al. | |
| 6,846,748 B2 | 1/2005 | Chien et al. | |
| 6,872,663 B1 | 3/2005 | Okada | |
| 6,878,500 B2 | 4/2005 | Rutter, Jr. et al. | |
| 2001/0014534 A1 * | 8/2001 | Aoki et al. ..................... | 438/689 |
| 2002/0037819 A1 | 3/2002 | Sahbari | |
| 2002/0128164 A1 | 9/2002 | Hara et al. | |
| 2003/0130149 A1 | 7/2003 | Zhou et al. | |
| 2003/0181344 A1 | 9/2003 | Ikemoto et al. | |
| 2003/0186175 A1 | 10/2003 | Ikemoto et al. | |
| 2003/0228990 A1 | 12/2003 | Lee et al. | |
| 2004/0048761 A1 | 3/2004 | Ikemoto | |
| 2004/0081922 A1 * | 4/2004 | Ikemoto et al. ............... | 430/329 |
| 2004/0147420 A1 | 7/2004 | Zhou et al. | |
| 2004/0256358 A1 | 12/2004 | Shimizu et al. | |
| 2005/0176259 A1 * | 8/2005 | Yokoi et al. ................... | 438/745 |
| 2006/0014656 A1 | 1/2006 | Egbe et al. | |
| 2006/0073997 A1 * | 4/2006 | Leonte et al. ................. | 510/175 |

FOREIGN PATENT DOCUMENTS

| | | |
|---|---|---|
| EP | 1 736 534 A1 | 12/2006 |
| JP | 2002357908 A | 12/2002 |
| WO | 0182002 A1 | 11/2001 |

OTHER PUBLICATIONS

"Resorcinol (CAS# 108-4603)", IS Chemical Technology, 2010.*
International Search Report of PCT/US2008/072923 dated Feb. 27, 2009.
Written Opinion of PCT/US2008/072923 dated Feb. 27, 2009.

* cited by examiner

*Primary Examiner* — Anca Eoff
(74) *Attorney, Agent, or Firm* — Dennis V. Carmen

(57) ABSTRACT

Resist stripping agents useful for fabricating circuits and/or forming electrodes on semiconductor devices for semiconductor integrated circuits and/or liquid crystals with reduced metal and metal alloy etch rates (particularly copper etch rates and TiW etch rates), are provided with methods for their use. The preferred stripping agents contain low concentrations of resorcinol or a resorcinol derivative, with or without an added copper salt, and with or without an added amine to improve solubility of the copper salt. Further provided are integrated circuit devices and electronic interconnect structures prepared according to these methods.

8 Claims, 2 Drawing Sheets

METAL CONSERVATION WITH STRIPPER SOLUTIONS CONTAINING RESORCINOL

This application claims the benefit of U.S. Provisional Application No. 60/956,030, filed Aug. 15, 2007, which is hereby incorporated by reference.

FIELD

The present disclosure relates to a resist and post-etch residue stripping agent containing resorcinol and/or a resorcinol derivative for use in fabricating circuits or forming electrodes on semiconductor devices for semiconductor integrated circuits, liquid crystal displays, and the like, and further to a method for producing semiconductor devices using the stripping agent without the loss of substantial amounts of metal from metal components.

BACKGROUND

The technology of fabricating semiconductor integrated circuits and MEMS devices has advanced with regard to the number of transistors, capacitors and other electronic devices which can be fabricated on a single component or device. This increasing level of integration has resulted in large part from a reduction in the minimum feature sizes of the integrated circuits and an increase in the number of layers involved. Today's design features, generally referred to as "sub-micron" have dropped below 0.25 microns. The manufacture of integrated circuit components having reduced size has placed new demands on all aspects of their production including the removal of resist and etch residues with chemical stripper solutions. Semiconductor devices for semiconductor integrated circuits or liquid crystal displays are commonly produced by a process including the steps of coating a substrate with a polymeric resist composition; patterning the resist film by exposure to light and subsequent development; etching exposed portions of the substrate using the patterned resist film as a mask to form minute circuits; and removing the resist film from the substrate. Alternatively, after forming minute circuits, the resist film can be ashed and the remaining resist residues removed from the substrate. A superior stripper solution should quickly remove resist residues and materials at moderate to low temperatures, have an acceptable effect on the all exposed components, have a substantial capacity for the dissolved resist and/or post etch residue to forestall both the precipitation of solids and the early disposal of the stripper solution. A superior stripper solution should also quickly remove resist residues in a rework process without substrate damage. Finally, superior stripper solutions should exhibit minimal toxicity.

A variety of stripper solutions have been developed which have performed satisfactorily in the manufacture of the early semiconductor devices. A substantial number of the early stripper solutions have been strongly alkaline solutions. The use of the alkaline stripper solutions to manufacture microcircuits containing metals, particularly tungsten or copper and its alloys can lead to metal loss. Various forms of metal loss, such as for example, corrosion pits and notching of metal lines, have been observed during the use of these alkaline strippers. In the case of tungsten, copper, and alloys, corrosion can occur in the heated dry organic stripping composition mixtures with dissolved oxygen providing the cathodic reaction. Although such metal losses were acceptable in the manufacture of the early semiconductor devices, devices having sub-micron components cannot tolerate such metal losses.

Efforts have been made to reduce the loss of metal during the fabrication of semiconductor devices by utilizing stripper solutions containing a variety of corrosion inhibitors. U.S. Pat. Nos. 6,276,372; 6,221,818; and 6,187,730 teach the use of a variety of gallic compounds which function as corrosion inhibitors in stripper solutions. U.S. Pat. Nos. 6,156,661 and 5,981,454 teach the use of an organic acid as a corrosion inhibitor in stripper solutions. U.S. Pat. Nos. 6,140,287; 6,000,411; and 6,110,881 teach the use of chelating agents as corrosion inhibitors in stripper solutions. U.S. Pat. Nos. 5,902,780; 5,672,577; and 5,482,566 teach the use of 1,2-dihydroxybenzene chelating agents as corrosion inhibitors in stripper solutions. U.S. Pat. No. 5,997,658 teaches the use of benzotriazole as a corrosion inhibitor in stripper solutions. U.S. Pat. No. 5,928,430 teaches the use of a gallic acid as a corrosion inhibitor in stripper solutions. U.S. Pat. No. 5,419,779 teaches the use of catechol, pyrogallol, anthranilic acid, gallic acid, and gallic ester as corrosion inhibitors in stripper solutions.

The corrosion inhibitors used thus far generally have a number of drawbacks which can include the following: (a) they are organic compounds not easily removed with a water rinse; (b) substantial quantities of the inhibitors are required and can affect the solution's stripping abilities; (c) inhibitors having chelating properties can adhere to metal and other component surfaces and interfere with performance; and (d) a component's toxicity and lack of biodegradability can make exposure to solutions undesirable and disposal of spent stripper solutions more difficult.

What is needed is a stripper solution for removing resists and post-etch residues, the stripper solution containing a component which: (a) can, at very low levels, prevent the dissolution of metals and their alloys, including copper and other metals as well as their alloys used in the fabrication of semiconductor devices; (b) is compatible with the stripper solution and doesn't interfere with its operation; (c) can be easily rinsed from a semiconductor device with water and/or a water soluble alcohol, leaving no residues; and (d) has low toxicity and does not negatively impact the biodegradability of the spent stripper solution. This present disclosure addresses and resolves these needs.

SUMMARY

A general object of the present invention is to provide a composition for removing resists, resist residues and post etch residues from a substrate containing a metallic component, such as for example copper, such compositions displaying a reduced metal etch rate. The composition includes a stripper solution and either resorcinol or a resorcinol derivative, the composition having a metal conservation factor (MCF) having a value of >0 and ≤1, where MCF is defined as:

$$MCF = \frac{(a-b)}{a},$$

where 'a' is an etch rate determined with a stripper solution not containing resorcinol or the resorcinol derivative and 'b' is an etch rate determined with the same stripper solution containing an etch inhibitor, such as for example, a resorcinol derivative. The term metal as used herein can refer to a metal such as for example copper and the like and/or a metal alloy such as for example TiW and the like. Resorcinol derivatives include 1,3-dihydroxybenzenes with or without one or more additional moieties added to an aromatic ring position or to one or both of the hydroxyl groups. The term "a resorcinol" or "resorcinols" will be used to refer to resorcinol itself and/or a derivative thereof. Preferred resorcinols are soluble in the stripper solution provided and can exist in a protonated form, a salt form, or a combination thereof, depending on the pH of the stripper solution. Resorcinol itself is preferred based on testing thus far and has proven effective in reducing copper etch rates utilizing a range of stripper solutions based on various combinations of amines, quaternary amine hydroxides and solvents. As used herein, the term resist refers to a photoresist or resist, a resist residue, a post etch residue, or a combination thereof.

Based upon results obtained thus far, reduced etch rates, as evidenced by a Metal Conservation Factor (MCF) ranging from greater than 0 and up to about 1 have generally been observed upon adding a resorcinol with or without an added copper salt to a variety of stripper solutions, including a range of commercial stripper formulations. Compositions including stripper solutions which particularly benefit from the addition of a resorcinol include those comprising dimethyl sulfoxide (DMSO), a quaternary ammonium hydroxide (the base), and an alkanolamine, with or without secondary solvent such as a glycol ether Another object of the present disclosure is to provide a composition for removing a photoresist or etch residue (resist residue) from a substrate containing a metal such as metallic copper, said composition comprising a stripper solution, a resorcinol, a copper salt, and optionally, an amine, said composition providing a lower etch rate than said stripper solution not containing a copper salt. Amines suitable for incorporation into the stripper solution can be monomeric amines and/or polymeric amines. A resorcinol/copper salt/amine combination is particularly suitable when a copper salt cannot be provided having sufficient solubility in the stripper solution. If utilized in combination with a metal salt having limited solubility in the stripper solution, the salt's solubility can be enhanced by the addition of a monomeric or polymeric amine. Copper salts having a +1 and +2 valence can be utilized in combination with a resorcinol. Examples of copper salts having such valences include CuCl and $Cu(NO_3)_2$. A level of copper salt ranging from about 0.001 g of copper salt for each 100 g of solution to about 0.1 g of copper salt for each 100 g of solution in combination with a resorcinol is generally preferred. A level of copper salt ranging from about 0.005 g of copper salt for 100 g of solution to about 0.075 g of copper salt for 100 g of solution is more suitable. A level of about 0.025 g of copper salt for 100 g of solution is most suitable.

Another object of the present disclosure is to provide a method for removing a photoresist and/or an etch residue (a resist residue) from a substrate containing a metal such as metallic copper or a metal alloy such as TiW. The method includes the steps of providing a substrate having a resist residue and a metal thereon, and contacting the substrate with a composition including a stripper solution and a resorcinol. Particularly suitable stripper solution/resorcinols have a MCF value of more than 0 and less than or equal to 1 to effect removal of the resist/etch residue. Contacting the substrate with a composition involves a composition including a resorcinol. As noted above, suitable stripper solutions can additionally contain a copper salt with or without an added amine, depending on solubility needs.

Particularly suitable stripper solutions used in the contacting step include those solutions comprising dimethyl sulfoxide, a quaternary ammonium hydroxide, an alkanolamine, with or without secondary solvent.

The step of contacting typically involves immersion of a substrate in a stripper solution or spraying the stripper solution onto the substrate using a spray tool. Further steps following contacting can involve the additional steps of removing the substrate from contact with the stripper solution and/or rinsing the substrate with an appropriate solvent. During the contacting step, the stripper solution is preferably maintained at a temperature of at least about 50° C. and more preferably at a temperature ranging from about 50° C. to about 85° C.

Another object of the present disclosure is to provide an electronic interconnect structure prepared in part by removing resist residues from a substrate having metal components according to the method described above to produce an interconnect structure with increased levels of intact metal. FIG. 2 illustrates a typical electronic interconnect structure having trenches 1 and 2 interconnected through via 3 within two dielectric layers 5 and 6 separated by a barrier layer 4. Trenches 1 and 2 and via 3 are typically filled with a metal such as copper.

Another object of the present disclosure is to provide an integrated circuit device obtainable in part by processing wafers containing metal components to remove resist residues according to the method described above with reduced metal etching. FIG. 3 illustrates a typical integrated circuit device having a plurality of computer chips illustrated by 1 interconnected through chip routers illustrated by 2.

A still further object of the present disclosure is to provide a method for preparing a stripper solution that provides reduced metal etch rates by providing a container; providing components of a stripper solution; providing a resorcinol; and adding the components and the resorcinol to the container to provide contents within the container. Providing components can include providing individual components, a composition containing various components, or combinations thereof. Further, adding components of a stripper solution can involve adding individual components, premixed components, and/or a preformed stripper solution containing provided components in substantially any order. A container can include substantially any vessel capable of holding a stripper solution and includes a typical container used for shipping or transporting a liquid product and/or equipment used to contain stripper solutions for use processing substrates to remove photoresists and/or etch residues.

DESCRIPTION

For the purposes of promoting an understanding of the present disclosure, references will now be made to the embodiments illustrated and specific language will be used to describe the same. It will nevertheless be understood that no limitation of the scope of what is claimed is thereby intended, such alterations and further modifications and such further applications of the principles thereof as illustrated therein being contemplated as would normally occur to one skilled in the art to which the disclosure relates.

Figure 1:
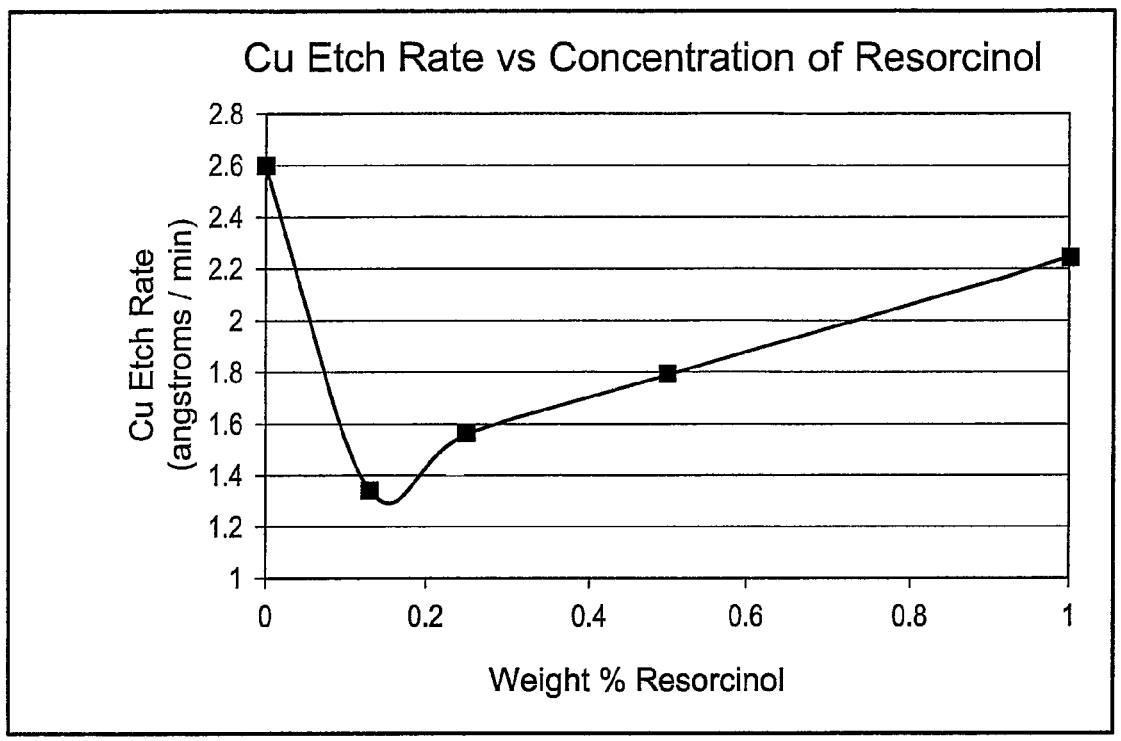
FIG. 1 illustrates a graphic representation of the relationship between the resorcinol content of a stripper solution and the copper etch rate which occurs upon exposing that solution to a substrate having exposed copper metal.
Figure 2:
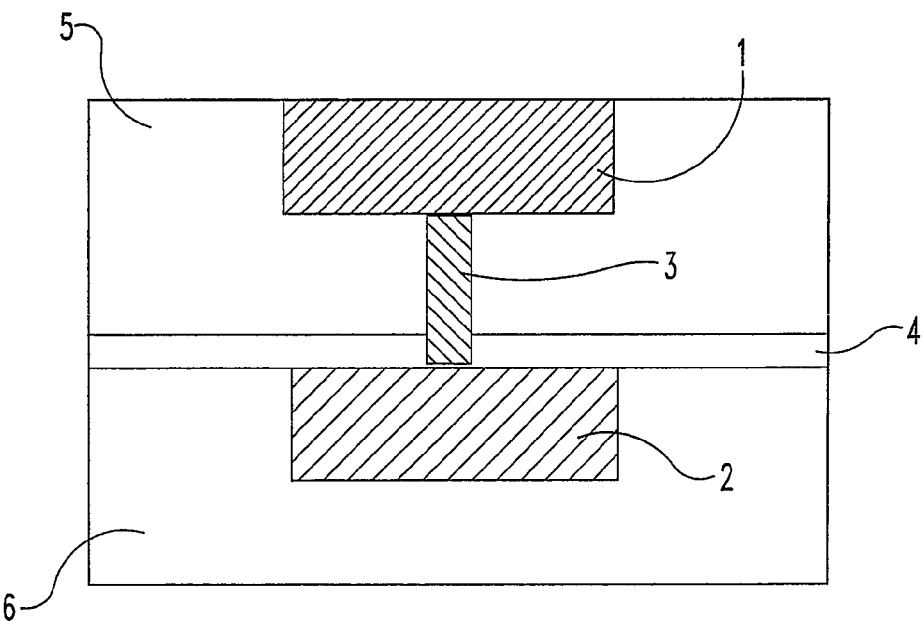
FIG. 2 illustrates an electronic interconnect structure.
Figure 3:
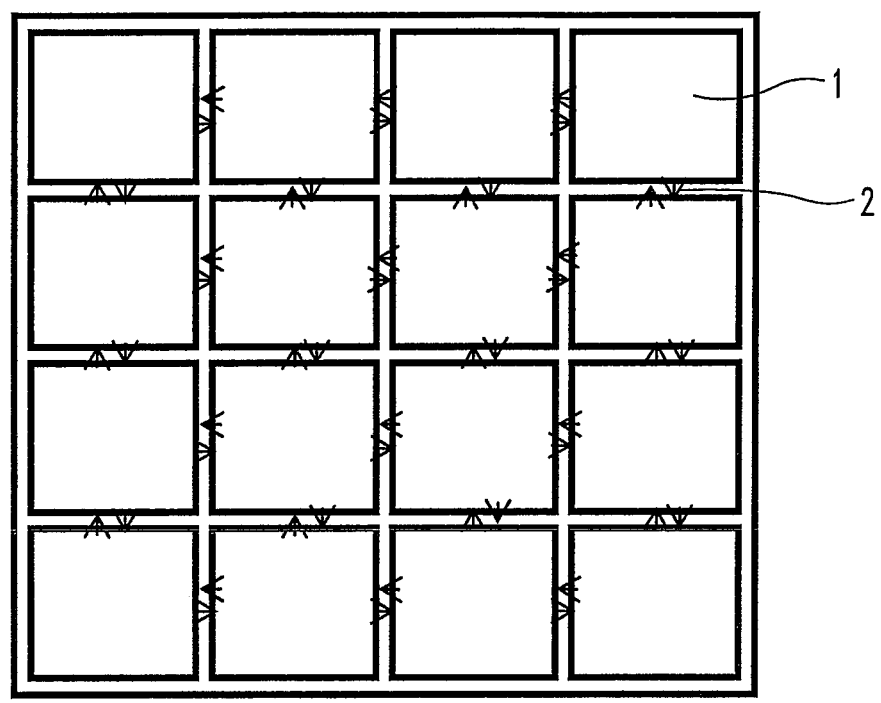
FIG. 3 illustrates an electronic device containing a plurality of electronic interconnect structures.

The compositions according to this present disclosure include a stripper solution containing resorcinol and/or a resorcinol derivative (a resorcinol), with or without a copper salt, and with or without an added amine. Such compositions have a metal conservation factor (MCF) of more than 0 and less than or equal to 1, illustrating a reduction in the etch rate of a metal such as metallic copper or an alloy such as TiW from a metal or alloy containing substrate in contact with the composition. Particularly suitable stripper solutions include those comprising dimethyl sulfoxide, a quaternary ammonium hydroxide, an alkanolamine, with or without secondary solvent such as for example a glycol ether. Preferred alkanolamines have at least two carbon atoms, at least one amino substituent and at least one hydroxyl substituent with the amino and the hydroxyl substituents attached to different carbon atoms. A preferred quaternary ammonium hydroxide is tetramethylammonium hydroxide. FIG. 1, based on data from Example 1 illustrates the effect of differing concentrations of resorcinol with stripper solutions containing dimethyl sulfoxide, monoethanolamine, tetramethylammonium hydroxide, 3-methyl-3-methoxybutanol, and a small amount of water on the etch rate of metallic copper. For stripper solutions in contact with copper, the levels of a resorcinol included in a stripper solution can range up to about 5 wt. %, but more commonly range about 0.02 wt. % to about 1 wt. %. Preferred levels of a resorcinol range from about 0.1 wt. % to about 0.25 wt. %. For stripper solutions in contact with aluminum, it can be advantageous to utilize higher levels of resorcinol, typically ranging up to about 7 wt. %.

In Example 2, substrates having a copper metal content were contacted with a variety of stripper solutions, with and without an added amount of resorcinol. The substrates were examined and their copper etch rates determined. A substantial reduction of the copper etch rates resulted with the addition to the stripper solutions of 0.25 wt. % of resorcinol to provide metal conservation factors (MCF's) ranging from 0.25 to 0.88. The results from Example 2 are tabulated in Table II below.

In Example 3, the copper etch rates and metal conservation factors (MCF) were determined for a broader range of stripper solutions having a variety of resorcinol derivatives added to the stripper solutions. The results obtained and tabulated in Table III below are similar to those obtained with the addition of resorcinol to the stripper solutions.

In Example 4, copper etch rates were determined for stripper solutions containing catechol, an additive currently added to stripper solutions to reduce copper etch, and resorcinol. A stripper solution containing 0.5 wt. % resorcinol provided a copper etch rate more than 10 times lower than the same stripper solution containing 7 wt. % catechol. This order of magnitude reduction in the copper etch rate with the addition of only about 1/10 as much resorcinol as catechol was unexpected and surprising. The results from Example 4 are provided in Table IV below.

In Example 5, substrates containing a TiW alloy were subjected to a variety of stripper solutions with and without an added amount (0.5 wt. %) of resorcinol. As in the previous examples the metal etch rates were determined for each stripper solution with and without added resorcinol. A reduction of etch rates has been demonstrated with the addition of resorcinol to for a majority of stripper solutions examined.

Example 6 illustrates the importance of determining the proper loading of resorcinol in order to reduce the metal etch rate. In Example 6, substrates containing aluminum were subjected to a stripper solution containing 35% hydroxylamine, from 0 to 10% resorcinol with the balance of the composition diglycol amine. The results are provided in Table VI. At resorcinol concentrations ranging from about 3 to about 7% of resorcinol, the stripper solutions exhibit reduced etch rates. It was unexpected and surprising that the metal etch rates would be so dependent on the concentration of resorcinol.

Studies carried out thus far have indicated that a variety of stripper solutions containing resorcinols provide substantially reduced metal etch rates for semiconductor substrates contacted with these solutions. The inclusion of an appropriate level of resorcinol in a stripper solution can reduce the etch rates of metals such as copper and alloys such as TiW at relatively low concentrations. For stripper solutions in contact with other metals such as for example, aluminum, higher levels of resorcinol are required to achieve the beneficial effect. The resorcinol/stripper solution combinations can further benefit by the addition of metal salts such as the salts of copper, cobalt, and the like. Although metal salt solubility can be facilitated by the inclusion of resorcinol, for resorcinol/stripper solutions in which the metal salt is not sufficiently soluble, the addition of an amine has provided solubility for the salt and the metal/amine salt combination. This combination has similarly provided beneficial reduced metal etch rates. Resorcinols alone or in combination with the metal salts, with or without an added amine, are compatible with a range of stripper solutions. The resorcinols do not interfere with the stripper solution's operation, can be easily rinsed from a semiconductor device or component with water or an alcohol, and leave no residues that could interfere with the device's operation. Finally, resorcinol, the resorcinol/metal salt combination, and resorcinol/metal salt/amine combination can be utilized at very low concentrations without increasing the solution's toxicity or negatively interfering with the biodegradability of the spent stripper solutions.

While applicants' disclosure has been provided with reference to specific embodiments above, it will be understood that modifications and alterations in the embodiments disclosed may be made by those practiced in the art without departing from the spirit and scope of the invention. All such modifications and alterations are intended to be covered.

EXAMPLES

Example 1

Etch Rates as a Function of Resorcinol Concentration

Stripper solution A was prepared for etch rate studies having the following formulation: Solution A—85.7% dimethylsulfoxide, 6.0% diethylene glycol methyl ether, 2.7% tetramethylammonium hydroxide, 2.7% aminoethylethanolamine, 2.8% water, and 0.1 Zonyl® FSO. Resorcinol was added to portions of stripper solution A with sufficient resorcinol in solution to provide concentrations of resorcinol in the stripper solution of 0.13%, 0.25%, 0.5% and 1%. Control solutions were used in the following etch rate studies having no resorcinol added.

Commercial sources of silicon wafers with blanket plasma vapor deposited thin copper films were divided into approximately 2 cm by 2 cm test samples for the study. The copper film thickness of each piece was measured three times using a four point probe and the average film thickness was calculated as the initial copper film thickness. For each solution tested, three test samples were immersed in a stripper solution for 30 minutes, rinsed and the copper film thickness measured again for each test sample. An average of copper film thickness for each test sample was taken as the resultant copper film thickness. A loss of copper film thickness was determined by subtracting the resultant copper film thickness from the initial film thickness. The loss of copper film thickness (in angstroms) observed in 30 minutes was divided by 30 to give an etch rate in the units of angstroms/minute. Table I summarizes the etch rates determined for stripper solution A containing different levels of resorcinol. FIG. 1 illustrates these results graphically. The resorcinol could be added directly to the stripper solution A, as in this example, or dissolved in a compatible component of a stripper solution prior to adding the remaining components.

applicable, has been designated in this example in terms of the solutions dryness coefficient (DC). The dryness coefficient is defined by the equation:

TABLE II $$DC = \frac{\text{mass of base/mass of solution tested}}{\text{mass of water/mass of solution tested}}$$

| Formula # | Formulation | Dryness Coefficient | pH | Copper Etch Rate (Å/min.) without resorcinol | Copper Etch Rate (Å/min.) with resorcinol | MCF |
|---|---|---|---|---|---|---|
| 1 | 86% DMSO<br>6% diethylene glycol monomethyl ether<br>2.7% tetramethylammonium hydroxide<br>2.5% N-(2-aminoethyl)-ethanol<br>2.8% water<br>0.03% Zonyl ® FSO surfactant* | 1 | 11.34 | 2.6 | 1.56 | 0.4 |
| 2 | 65% DMSO<br>25% monoethanolamine<br>5% tetramethylammonium hydroxide<br>5% water | 1 | 11.80 | 1.2 | 0.9 | 0.25 |
| 3 | 45% DMSO<br>25% monoethanolamine<br>10% tetramethylammonium hydroxide<br>10% 3-methyl-3-methoxybutanol<br>10% water | 1 | 12.03 | 3.3 | 0.9 | 0.72 |
| 4 | 92% DMSO<br>2% tetramethylammonium hydroxide<br>6% water | 0.3 | 11.38 | 43.0 | 5 | 0.88 |
| 5 | 29.5% diethyleneglycolamine<br>30.5% N-methylpyrrolidone<br>5% γ-butyrolactone<br>35% diethyleneglycol butyl ether | Dryness coefficient not applicable | 10.82 | 20.2 | 4 | 0.63 |

*Zonyl ® FSO fluorinated surfactant available from E. I. DuPont de Nemours and Company, 1007 Market St, Wilmington Delaware 19898 and "Zonyl" is a registered trademark of that same company.

TABLE 1

| Weight Percent Resorcinol | Etch Rate for Solution A Angstroms/minute | MCF |
|---|---|---|
| 1.0 | 2.24 | 0.14 |
| 0.5 | 1.79 | 0.31 |
| 0.25 | 1.56 | 0.40 |
| 0.13 | 1.34 | 0.48 |
| 0 | 2.6 | N.A. |

Example 2

Copper Etch Rates for Copper Wafers in a Variety of Stripper Solution Formulations with and without the Addition of Resorcinol A variety of stripper solutions formulations provided in Table II below were contacted with test strips of the type described in Example I as described therein. Each formulation was tested with and without added resorcinol and the copper etch rates determined. Formulations 1-5 containing added resorcinol had 0.25% by weight. All copper wafers tested were purchased from Silicon Valley Microelectronics, Inc. The water content of the various stripper solutions, where

Example 3

Copper Etch Rates for Copper Wafers in a Variety of Stripper Solutions with and without the Addition of Derivatives of Resorcinols A variety of stripper solution formulations provided in Table III below were contacted with test strips of the type described in Example I as described therein. Each formulation was tested with and without an added derivative of resorcinol and the copper etch rates determined. Formulations containing the added derivative of resorcinol contained 0.5% by weight of the additive. The copper wafers used in this Example were obtained from a non-commercial source determined to be generally interchangeable with the commercial wafers utilized in Example 2.

TABLE III

| Formula # | Formulation | pH | Copper Etch Rate (Å/min.) | MCF |
|---|---|---|---|---|
| 1 | 29.5% diethyleneglycolamine<br>30.5% N-methylpyrrolidone<br>5% γ-butyrolactone<br>35% diethyleneglycol butyl ether | 9.89 | 20.2 | N/A |
| 2 | 29.5% diethyleneglycolamine<br>30% N-methylpyrrolidone<br>5% γ-butyrolactone<br>35% diethyleneglycol butyl ether<br>0.5% resorcinol | 10.82 | 4 | 0.8 |

TABLE III-continued

| Formula # | Formulation | pH | Copper Etch Rate (Å/min.) | MCF |
|---|---|---|---|---|
| 3 | 29.5% diethyleneglycolamine<br>30% N-methylpyrrolidone<br>5% γ-butryolactone<br>35% diethyleneglycol butyl ether<br>0.5% 1,3-dihydroxymethylbenzene | 9.8 | 4.7 | 0.77 |
| 4 | 29.5% diethyleneglycolamine<br>30% N-methylpyrrolidone<br>5% γ-butryolactone<br>35% diethyleneglycol butyl ether<br>0.5% 1,3-dimethoxybenzene | 9.8 | 9.3 | 0.54 |
| 5 | 29.5% diethyleneglycolamine<br>30% N-methylpyrrolidone<br>5% γ-butryolactone<br>35% diethyleneglycol butyl ether<br>0.5% 2-carboxy-1,3-dihydroxybenzene | 9.4 | 7.5 | .63 |

Example 4

Copper Etch Rates for Copper Wafers in a Stripper Solution Formulations with Catechol, a Common Corrosion Inhibitor and then Replaced with the Addition of Resorcinol The stripper solution formulations provided in Table IV below were contacted with test strips of the type described in Example I as described therein. Formulation 1 contains a known corrosion inhibitor, catechol. Formulation 2 has the catechol replaced with resorcinol at a lower concentration and the copper etch rates were determined for both formulations.

TABLE IV

| Formula # | Formulation | pH | Copper Etch Rate (Å/min.) |
|---|---|---|---|
| 1 | 35% hydroxylamine<br>7% catechol | 5.2 | 139.5 |
| 2 | 58% diglycol amine<br>35% hydroxylamine<br>0.5% resorcinol<br>64.5% diglycol amine | 5.4 | 10.0 |

Example 5

Titanium Tungsten (TiW) Etch Rates for TiW Wafers in a Variety of Stripper Solution Formulations with and without the Addition of Resorcinol A variety of stripper solutions formulations provided in Table V below were contacted with test strips. The test strips were cleaved from commercial sources of silicon wafers with blanket plasma vapor deposited thin TiW films and were approximately 2 cm by 2 cm in size. The TiW film thickness of each piece was measured three times using a four point probe and the average film thickness was calculated as the initial TiW film thickness. For each solution tested, three test samples were immersed in a stripper solution for 30 minutes, rinsed and the TiW film thickness measured again for each test sample. An average of TiW film thickness for each test sample was taken as the resultant TiW film thickness. A loss of TiW film thickness was determined by subtracting the resultant TiW film thickness from the initial film thickness. The loss of TiW film thickness (in angstroms) observed in 30 minutes was divided by 30 to give an etch rate in the units of angstroms/minute. Each formulation was tested with and without added resorcinol and the TiW etch rates determined. All formulations contained resorcinol added at 0.5% by weight.

TABLE V

| Formula # | Formulation | Dryness Coefficient | pH | TiW Etch Rate (Å/min). without resorcinol | TiW Etch Rate (Å/min). with resorcinol | MCF |
|---|---|---|---|---|---|---|
| 1 | 81.5% DMSO<br>4.5% monoethanolamine<br>2.0% tetramethylammonium hydroxide<br>10% 3-methyl-3-methoxybutanol<br>2.0% water | 1 | 11.38 | 5.6 | 2.9 | 0.48 |
| 2 | 81.9% DMSO<br>3.0% monoethanolamine<br>2.55% tetramethylammonium hydroxide<br>10% 3-methyl-3-methoxybutanol<br>2.55% water | 1 | 11.49 | 11.7 | 3.3 | 0.72 |
| 3 | 65% DMSO<br>25% monoethanolamine<br>5% tetramethylammonium hydroxide<br>5% water | 1 | 11.80 | 2.1 | 0.3 | 0.86 |
| 4 | 45% DMSO<br>25% monoethanolamine<br>10% tetramethylammonium hydroxide<br>10% 3-methyl-3-methoxybutanol<br>10% water | 1 | 12.03 | 3.5 | 0.6 | 0.83 |
| 5 | 86% DMSO<br>6% diethylene glycol monomethyl ether<br>2.7% tetramethylammonium hydroxide<br>2.5% aminoethylethanolamine<br>2.8% water<br>0.03% surfactant* | 1 | 11.34 | 2.0 | 2.8 | −0.40 |

TABLE V-continued

| Formula # | Formulation | Dryness Coefficient | pH | TiW Etch Rate (Å/min). without resorcinol | TiW Etch Rate (Å/min). with resorcinol | MCF |
|---|---|---|---|---|---|---|
| 6 | 88% DMSO<br>6% diethylene glycol monomethyl ether<br>2.7% tetramethylammonium hydroxide<br>2.8% aminoethylethanolamine<br>0.96% water<br>0.03% surfactant* | 2.8 | 11.34 | 1.0 | 4.9 | −0.80 |
| 7 | 92% DMSO<br>2% tetramethylammonium hydroxide<br>6% water | 0.3 | 11.38 | 19.4 | 28.0 | −0.31 |

*Zonyl ® FSO fluorinated surfactant available from E. I. DuPont de Nemours and Company, 1007 Market St, Wilmington Delaware 19898 and "Zonyl" is a registered trademark of that same company.

Example 6

Aluminum Etch Rates for Aluminum Wafers in a Specific Stripper Solution Formulations with and without the Addition of Resorcinol The methods described above were utilized to determine the etch rates for substrates containing aluminum when exposed to a stripper formulation containing resorcinol in amounts ranging from 0 wt. % to 10 wt. %. The etch rates and metal conservation factors obtained are provided in Table VI below. The results illustrate the importance of resorcinol concentration for selected stripper formulations exposed to certain metals.

TABLE VI

| Formula | Formulation | Metal Etch Rate (Å/min) | MCF |
|---|---|---|---|
| 1 | 35% hydroxylamine<br>0% resorcinol<br>balance diglycol amine | 3.5 | Not Applicable |
| 2 | 35% hydroxylamine<br>0.50% resorcinol<br>balance diglycol amine | 5.5 | −0.57 |
| 3 | 35% hydroxylamine<br>1.0% resorcinol<br>balance diglycol amine | 4.4 | −0.26 |
| 4 | 35% hydroxylamine<br>3.0% resorcinol<br>balance diglycol amine | 3.3 | 0.06 |
| 5 | 35% hydroxylamine<br>7.0% resorcinol<br>balance diglycol amine | 2.1 | 0.40 |
| 6 | 35% hydroxylamine<br>10.0% resorcinol<br>balance diglycol amine | 4.6 | −0.31 |

While applicant's invention has been described in detail above with reference to specific embodiments, it will be understood that modifications and alterations in embodiments disclosed may be made by those practiced in the art without departing from the spirit and scope of the invention. All such modifications and alterations are intended to be covered. In addition, all publications cited herein are indicative of the level of skill in the art and are hereby incorporated by reference in their entirety as if each had been individually incorporated by reference and fully set forth.

We claim:

1. A method for removing a resist from a substrate comprising the acts of:
    (a) providing a substrate having a resist and metal thereon; and
    (b) contacting said substrate with a composition wherein said composition comprises about 29.5 wt % diethyleneglycolamine, about 30 wt % N-methylpyrrolidone, about 5 wt % γ-butyrolactone, about 35 wt % diethyleneglycol butyl ether, and about 0.5 wt % resorcinol or 1,3-dihydroxybenzene derivative, wherein said 1,3-dihydroxybenzene derivative is selected from the group consisting of 1,3-dihydroxymethylbenzene, 1,3-dimethoxybenzene, 2-carboxy-1,3-dihydroxybenzene and mixtures thereof, wherein the weight % of the constituents is based on the total weight of the composition.

2. A method for removing a resist from a substrate comprising the acts of:
    (a) providing a substrate having a resist and metal thereon; and
    (b) contacting said substrate with a composition wherein said composition comprises about 35 wt % hydroxylamine, about 64.5 wt % diglycol amine, and about 0.5 wt % resorcinol, wherein the weight % of the constituents is based on the total weight of the composition.

3. A composition for removing a resist residue from a substrate containing metal selected from the group consisting of copper, tungsten, titanium, and combinations thereof, said composition comprising about 29.5 wt % diethyleneglycolamine, about 30% N-methylpyrrolidone, about 5 wt % γ-butyrolactone, about 35 wt % diethyleneglycol butyl ether, and about 0.5 wt % resorcinol or 1,3-dihydroxybenzene derivative, wherein said 1,3-dihydroxybenzene derivative is selected from the group consisting of 1,3-dihydroxymethylbenzene, 1,3-dimethoxybenzene, 2-carboxy-1,3-dihydroxybenzene and mixtures thereof, wherein the weight % of the constituents is based on the total weight of the composition.

4. A composition for removing a resist residue from a substrate containing metal selected from the group consisting of copper, tungsten, titanium, and combinations thereof, said composition comprising about 35 wt % hydroxylamine, about 64.5 wt % diglycol amine, and about 0.5 wt % resorcinol, wherein the weight % of the constituents is based on the total weight of the composition.

5. A method for removing a resist from a substrate comprising the acts of:
    (a) providing a substrate having a resist and metal thereon; and
    (b) contacting said substrate with a composition including a stripper solution comprising about 86 wt % DMSO, about 2.7 wt % tetramethylammonium hydroxide, about 2.5% N-(2-aminoethyl)-ethanol, and about 2.8 wt % water and a corrosion inhibitor consisting essentially of from about 0.02 wt. % to about 1 wt. % of a resorcinol, wherein the weight % of the constituents is based on the total weight of the composition.

6. A method for removing a resist from a substrate comprising the acts of:
   (a) providing a substrate having a resist and metal thereon; and
   (b) contacting said substrate with a composition including a stripper solution comprising: (a) about 65 wt % DMSO, (b) about 25 wt % monoethanolamine, (c) about 5 wt % tetramethylammonium hydroxide and (d) about 5 wt % water and (e) a corrosion inhibitor consisting essentially of from about 0.02 wt. % to about 1 wt. % of a resorcinol, wherein the weight % is based on the total weight of the constituents (a)-(d) of the composition.

7. A method for removing a resist from a substrate comprising the acts of:
   (a) providing a substrate having a resist and metal thereon; and
   (b) contacting said substrate with a composition including a stripper solution comprising: (a) about 92 wt % DMSO, (b) about 2 wt % tetramethylammonium hydroxide and (c) about 6 wt % water and (d) a corrosion inhibitor consisting essentially of from about 0.02 wt. % to about 1 wt. % of a resorcinol, wherein the weight % is based on the total weight of the constituents (a)-(c) of the composition.

8. A method for removing a resist from a substrate comprising the acts of:
   (a) providing a substrate having a resist and metal thereon; and
   (b) contacting said substrate with a composition including a stripper solution comprising: (a) about 29.5 wt % diethyleneglycolamine, (b) about 30.5 wt % N-methylpyrrolidone, (c) about 5 wt % γ-butyrolactone, (d) about 35 wt % diethyleneglycol butyl ether and (e) a corrosion inhibitor consisting essentially of from about 0.02 wt. to about 1 wt. % of a resorcinol, wherein the weight % is based on the total weight of the constituents (a)-(d) of the composition.

* * * * *